United States Patent [19]
Suzuki

[11] Patent Number: 5,748,558
[45] Date of Patent: May 5, 1998

[54] SEMICONDUCTOR MEMORY DEVICE

[75] Inventor: Azuma Suzuki, Tokyo, Japan

[73] Assignee: Kabushiki Kaisha Toshiba, Kawasaki, Japan

[21] Appl. No.: 508,754

[22] Filed: Jul. 31, 1995

[30] Foreign Application Priority Data

Jul. 29, 1994 [JP] Japan ................................. 6-178464

[51] Int. Cl.$^6$ ................................................ G11C 8/00
[52] U.S. Cl. ........................................ 365/233; 365/230.08
[58] Field of Search ........................... 365/233, 230.08, 365/189.05

[56] References Cited

U.S. PATENT DOCUMENTS 5,341,341  8/1994  Fukuzo .......................... 365/230.08
5,550,783  8/1996  Stephens ........................... 365/233

Primary Examiner—A. Zarabian
Attorney, Agent, or Firm—Foley & Lardner

[57] ABSTRACT

A semiconductor memory device of the present invention is so constituted that, in addition to a first address register for fetching and holding an address signal in synchronous with a clock signal irrespective of read operation and write operation, a second address register is provided to hold a write address, and an address selection circuit selects the held write address to write data held in an input data register into a cell. Thereby, a late write system can be achieved in an synchronous SRAM.

16 Claims, 12 Drawing Sheets

SEMICONDUCTOR MEMORY DEVICE

BACKGROUND OF THE INVENTION

1. Field of the Invention

The present invention relates to a semiconductor memory device of a synchronous type static random access memory (SRAM) using a clock signal and, more particularly, a semiconductor memory device employing a late write system that data is written in a succeeding cycle after a write address is defined.

2. Description of the Prior Art

FIG. 1 is a circuit diagram showing a configuration of a conventional synchronous type SRAM. In FIG. 1, the SRAM comprises an address register 101 in an address decoder 100. An address signal supplied from the external is stored in the address register 101 in synchronous with a clock signal K generated internally based on an external clock signal. Similarly, the SRAM comprises registers 102 and 103 for holding a chip select signal /S and a write signal /W respectively. While, with respect to an I/O buffer signal DQ, an input data register 104 and an output data register 105 are provided.

A write/read controller 106 generates a signal SWE for controlling a load circuit (not shown) of bit lines in accordance with write operation and write operation, a signal SAE for activating a sense amplifier (SA) 107, and a signal WP for activating a write transistor (WT) 107. The address register 101 is provided correspondingly to a certain address. A memory cell in a cell array 108 is always selected according to the address signal held in the address register 101. Read data is read from the memory cell via an output buffer 109 which is controlled by a data output control signal /G.

FIGS. 2 to 4 are circuit diagrams each showing an example of a configuration of a latch circuit in the address register shown in FIG. 1. Two latch circuits constituting the register are shown in FIGS. 2 and 3, for instance. A clocked NAND circuit adopting a multi-input (IN1, IN2) logic is shown in FIG. 4, for instance.

FIG. 5 is a timing chart showing an example of read operation cycle and write operation cycle of the SRAM shown in FIG. 1. In FIG. 5, responding to an address A1 in a read (R) operation in cycle 1, read data Q1 is read in read cycle 2. Similarly, responding to an address A2 in read cycle 2, read data Q2 is read in cycle 3. In write cycle 5, a write operation is executed. In response to an address A3, data D3 is written. The write operation is terminated in cycle 5.

In this SRAM, in case a bit configuration becomes large like a 32 bit configuration, for instance, the number of input/output pads is increased. Therefore, an I/O common scheme in which the input/output pads are used commonly is adopted in the SRAM. In this scheme, as shown in FIG. 5, in order to avoid a collision of the read data Q2 with the write data D3, dead cycles 3, 4 wherein no operation is caused are inserted between read cycle 2 and write cycle 5. Therefore, if a series of operations such that write operation is effected two times after read operation is effected twice are performed continuously, dead cycles are inserted into cycles 3, 4 and cycles 9, 10, so that twelve cycles are required for the series of operations. The dead cycle is defined as a particular cycle where no address signal is input.

As a result, in the I/O common scheme, two wasteful cycles are required because of dead cycles every time when the operation of the SRAM is changed from the read operation to the write operation. Thus, a total working time is increased inevitably.

FIG. 6 is a timing chart showing an example of operation timing in the late write scheme. In order to overcome the above drawback, a late write system shown in a timing chart of FIG. 6 has been proposed. The late write system is defined as such system that a write address is decided in one preceding cycle to the cycle in which data is input from the I/O pad.

In FIG. 6, read timing of data Q2 and write timing of data D3 are similar to those of FIG. 5. However, write address A3 used to write data D3 is input in cycle 4. Thus, the dead cycle 4 can be eliminated. In this situation, if the same read and write operations as those in FIG. 5 are effected in the late write system, the operation of the SRAM can be terminated in cycle 11. Therefore, the operation can be terminated more quickly by one cycle than the aforementioned system.

As shown in FIG. 6, the write timing in the late write system has been proposed. However, in a circuit configuration to attain the above late write system, the write address must be defined in one preceding cycle to the write cycle wherein data is input to be written. For this reason, it is impossible to attain the above late write scheme only by the single address register 101 shown in FIG. 1.

Moreover, in the write operation, write data must be supplied to the bit line by activating the word line to be selected in one write cycle. However, the word line used in one preceding cycle is still being activated at beginning portion of the write cycle, and thus the word line to be selected in the write cycle is activated in the middle of the write cycle. Therefore, write data cannot be supplied to the bit line simultaneously with starting of the write cycle, so that a supply of write data must be delayed until the word line to be selected is activated.

This causes a margin of the write operation to be reduced. In addition, since, in the read operation immediately after the write operation, the bit line cannot be restored up to a potential level enough for the read operation due to the above reasons, the read operation should be delayed. These drawbacks become dominant in the large capacity and high speed SRAM.

As has been discussed advance, in the conventional synchronous type SRAM having only one address register therein, the late write system capable of avoiding a collision of data in the I/O common scheme could not be embodied. Further, in the conventional synchronous type SRAM, there has been caused a drawback that a margin of the write operation is reduced because a definition of the word line is delayed. Furthermore, in the read operation subsequent to the write operation, there has been caused another drawback that a reading time of data must be prolonged since a potential level of the bit line enough for the read operation cannot be obtained.

SUMMARY OF THE INVENTION

The present invention has been made in view of the above circumstances, and an object of the present invention is to provide a semiconductor memory device capable of attaining a late write system which can avoid a collision of data in an I/O common scheme used in a synchronous type SRAM.

Another object of the present invention is to provide a semiconductor memory device capable of increasing a margin of write operation and eliminating a delay in read operation immediately after the write operation in a synchronous type SRAM which enables a write operation in a late write system.

In order to achieve the above objects, a semiconductor memory device of a static random access memory employing a late write system wherein access operations are effected in synchronous with a clock signal and data is written in succeeding write cycle after a write address is defined, comprises a first address holding circuit for fetching, holding and outputting an address signal in synchronous with said clock signal, a second address holding circuit for fetching, holding and outputting a write address signal of address signals held in said first address holding circuit in synchronous with said clock signal, an address selection circuit for selecting either a first address signal held in said first address holding circuit as an address signal supplied to an accessed cell or a second address signal held in said second address holding circuit, a data holding circuit for fetching, holding and outputting write data, a comparator circuit for comparing said first address signal with said second address signal, and an output data selection circuit for selecting said write data held in said data holding circuit if said first address signal coincides with said second address signal in a comparison result by said comparator circuit and for selecting read data read out from said accessed cell unless said first address signal coincides with said second address signal and for outputting selected data as output data.

In addition, in a semiconductor memory device of the present invention, write operation in the last write cycle of continuous write cycles is effected before next write cycle succeeding to said last write cycle is executed.

Further, in a semiconductor memory device of the present invention, said address selection circuit is selectively controlled according to an internal read signal and an internal write signal generated based on an external access control signal, and selects said first address signal at the time of read operation and selects said second address signal at the time of write operation.

Furthermore, in a semiconductor memory device of the present invention, said write address signal is fetched and held in said second address holding circuit in a first write cycle, a cell is selected by said write address signal, and write data held in said data holding circuit is written in a selected cell at commencement of a second write cycle.

Moreover, in a semiconductor memory device of the present invention, a storage cycle wherein write operation is performed based on said write address signal which is fetched and held in said second address holding circuit in the last write cycle of continuous write cycles is set before next write cycle succeeding to the last write cycle.

In turn, in a semiconductor memory device of the present invention, said address selection circuit is selectively controlled by an external chip select signal or a data output control signal, selects a first address signal at the time of read operation and write operation, and selects a second address signal in said storage cycle which is set before next write cycle succeeding to the last write cycle.

Subsequently, in a semiconductor memory device of the present invention, in response to said write address signal which is fetched and held in said second address holding circuit in the last write cycle of continuous write cycles, write data held in said data holding circuit is selected and read by said data selection circuit in next read cycle succeeding to said last write cycle.

In addition, in a semiconductor memory device of the present invention, said address selection circuit is selectively controlled by an external chip select signal or a data output control signal, selects a first address signal at the time of read operation and write operation, and selects a second address signal at the first half of next write cycle succeeding to the last write cycle.

Further, in a semiconductor memory device of the present invention, write operation based on a write address signal which is fetched and held in said second address holding circuit in the last write cycle of continuous write cycles is effected at said first half of said next write cycle succeeding to said last write cycle.

In the above configuration, in the present invention, irrespective of the read operation and the write operation, the address signal is written into the second address holding circuit which is provided in addition to the first address holding circuit and held therein, and data is written into the cell by selecting the cell in accordance with the held write address. In addition, in the present invention, the written cell can be selected in the cycle where the write address is fetched and held, and thus data can be supplied to the bit line at the commencement of next cycle. Moreover, in the present invention, the address and data in the last write cycle of the continuous write cycles are held, and the held data is read out when input read address coincides with the held address. Furthermore, in the present invention, the address and data in the last write cycle of the continuous write cycles are held, and the write operation can be executed using held address and data at the first half of the succeeding write cycle.

DESCRIPTION OF THE PREFERRED EMBODIMENTS

There will now be described preferred embodiments of a semiconductor memory device of the present invention hereinafter with reference to the accompanying drawings.

(First Embodiment)

Figure 1:
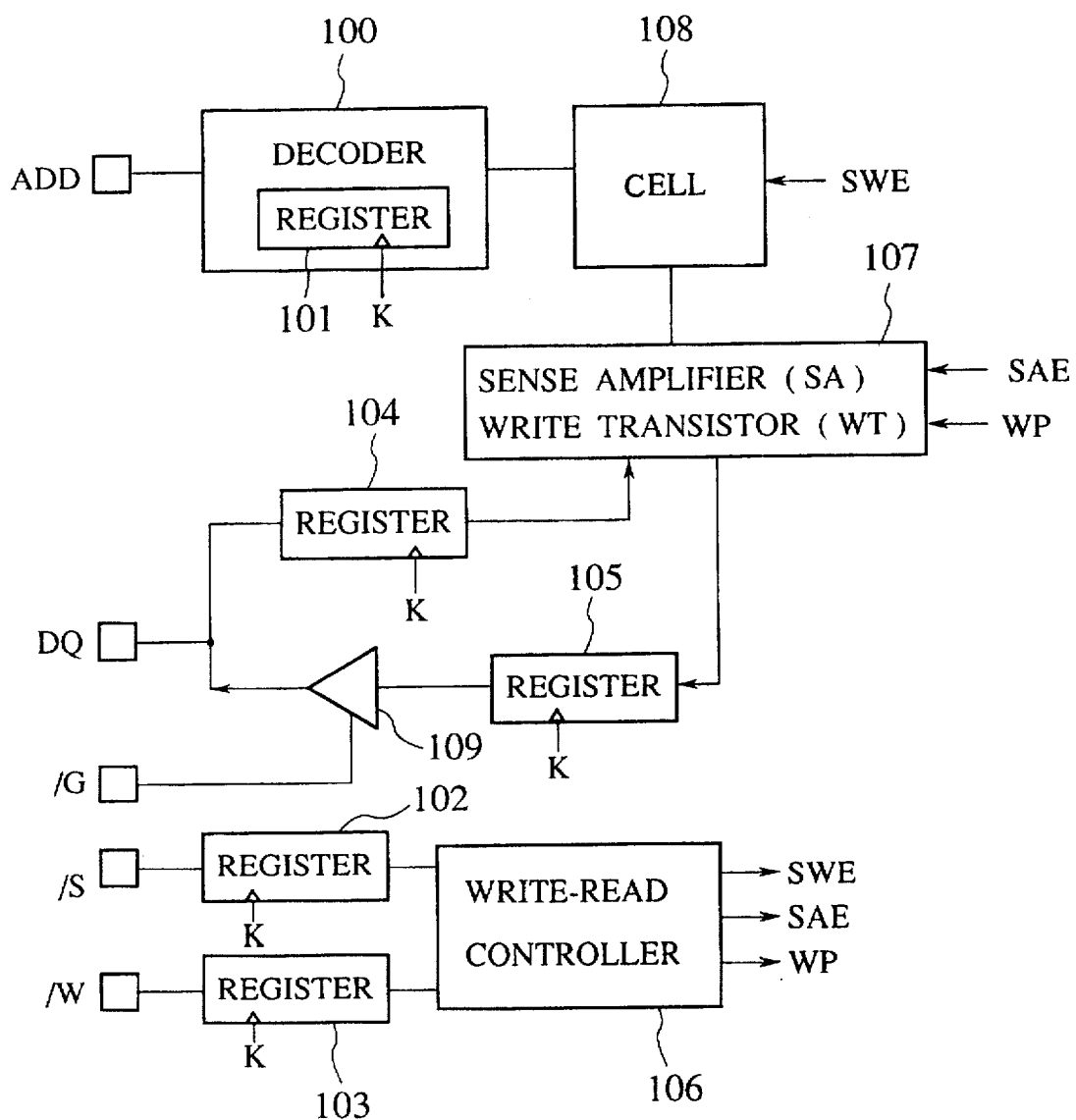
FIG. 1 is a block circuit diagram showing an example of a configuration of a conventional synchronous type SRAM.
Figure 2:
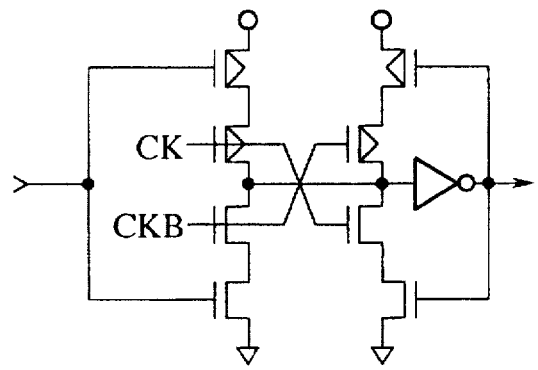
FIG. 2 is a circuit diagram showing an example of a configuration of a latch circuit of an address register shown in FIG. 1.
Figure 3:
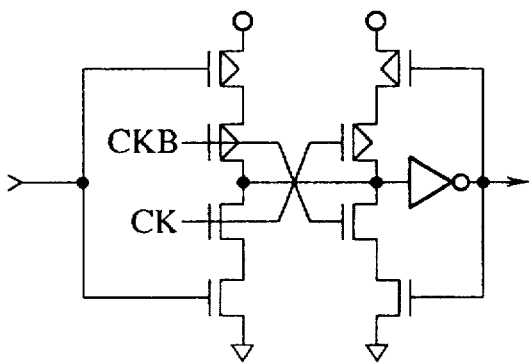
FIG. 3 is a circuit diagram showing an example of a configuration of another latch circuit of an address register shown in FIG. 1.
Figure 4:
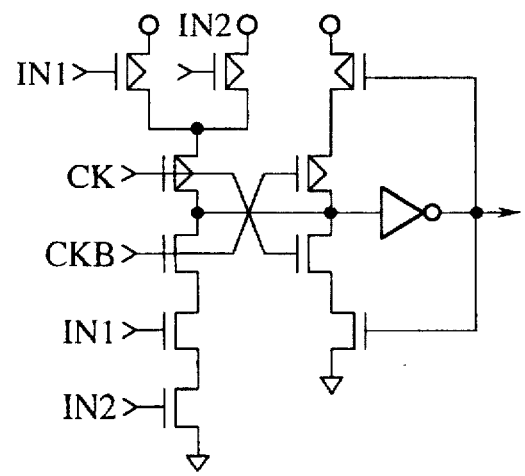
FIG. 4 is a circuit diagram showing an example of a configuration of still another latch circuit of an address register shown in FIG. 1.
Figure 5:
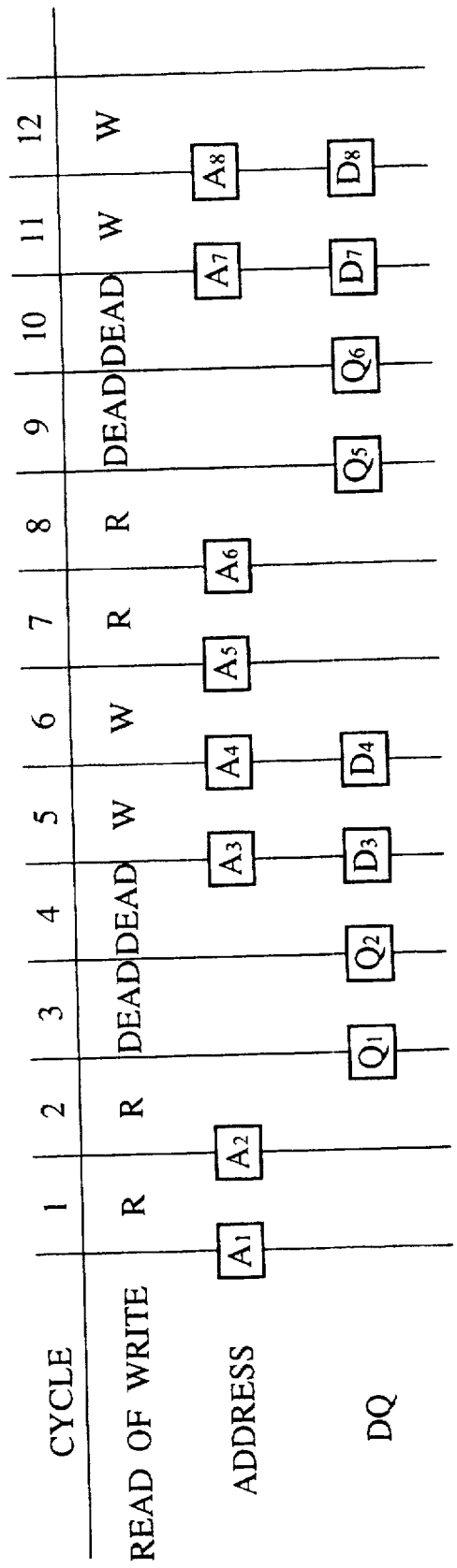
FIG. 5 is a timing chart showing an example of operation timing of a configuration shown in FIG. 1.
Figure 7:
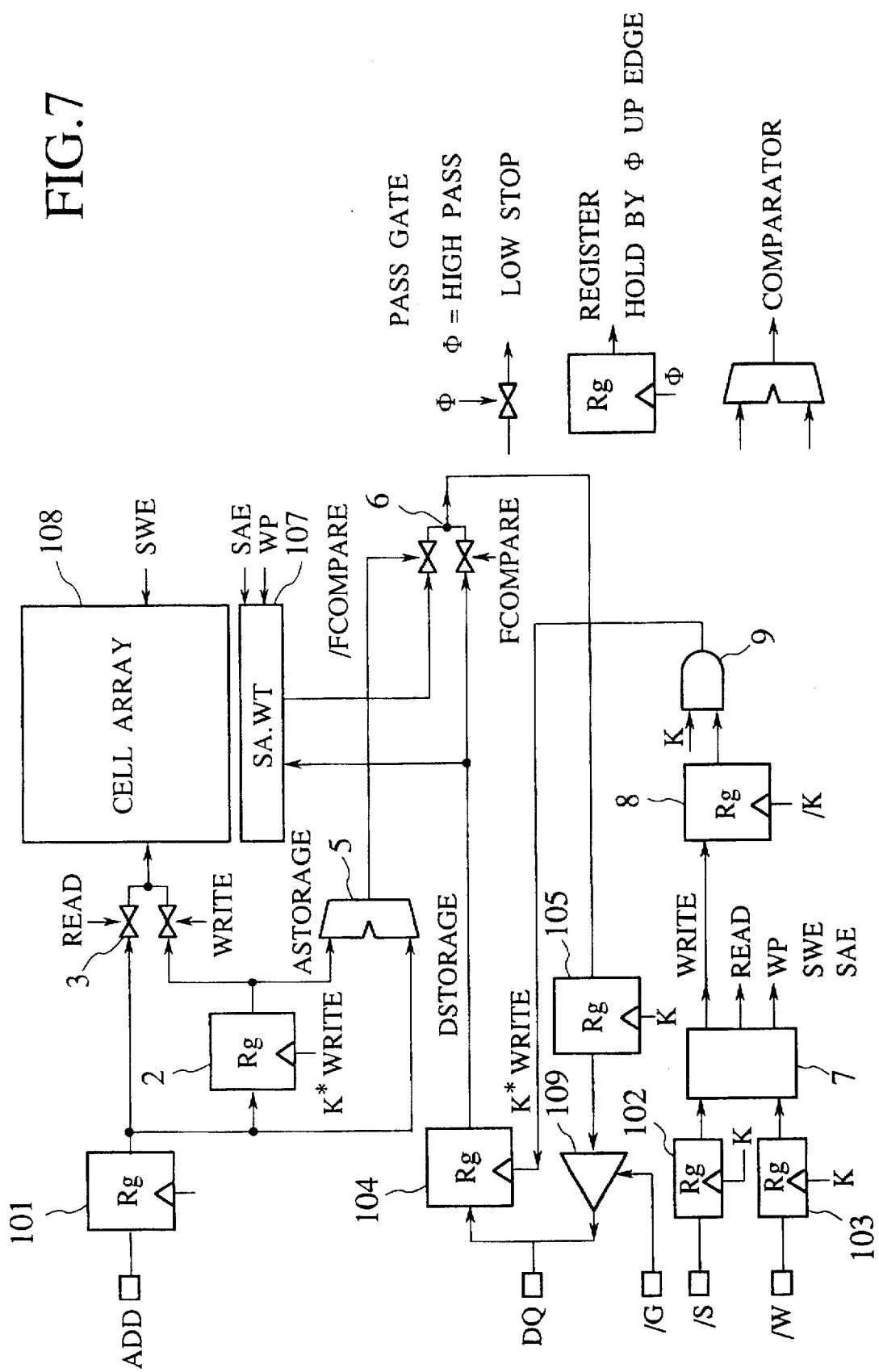
FIG. 7 is a circuit diagram showing a configuration of a semiconductor memory device of a synchronous type SRAM according to a first embodiment of the present invention.

FIG. 7 is a circuit diagram showing a configuration of a semiconductor memory device composed of a synchronous type SRAM according to a first embodiment of the present invention, capable of effecting write operation in a late write system. In FIG. 7, the same constituent elements as those in FIG. 1 have the identical reference symbols to those in FIG. 1 and part of explanations thereof are omitted.

In FIG. 7, there is shown the synchronous type SRAM that effects access operation in synchronous with a clock signal, and writes data in succeeding write cycle after a write address is defined according to a late write system. The synchronous type SRAM comprises, as pertinent constituent portions, a first address register 101 for fetching, holding and outputting an address signal in synchronous with a clock signal K generated internally based on an external clock signal, a second address register 2 for fetching, holding and outputting a write address signal of the address signals held in the first address register 101 in synchronous with a logical product (*) of the clock signal K and a control signal WORK, an address selection circuit 3 for selecting either a first address signal held in the first address register 101 as an address signal supplied to a cell to be accessed in a cell array 108 or a second address signal (write address signal) held in the second address register 2 according to a read control signal READ or a write control signal WRITE, an input data register 104 for fetching, holding and outputting write data, a comparator circuit 5 for comparing the first address signal with the second address signal, and an output data selection circuit 6 for selecting write data held in the input data register 104 by activating a signal FCOMPARE of the comparator circuit 5 if the first address signal coincides with the second address signal in a comparison result by the comparator circuit 5 and selecting read data read out from the cell to be accessed by activating an inverted signal /FCOMPARE of a signal FCOMPARE of the comparator circuit 5 unless the first address signal coincides with the second address signal, and for outputting selected data as output data.

In addition, the synchronous type SRAM comprises a control signal generating circuit 7 for generating internally a read control signal READ and a write control signal WRITE and a signal WP, a signal SWE and a signal SAE according to a chip select signal /S and a write signal /W, both supplied from the external and held in corresponding registers 102 and 103, a register 8 for holding and outputting the write control signal WRITE in synchronous with the inverted signal /K of the clock signal, and an AND circuit 9 for outputting a logical product of the write control signal WRITE held in the register 8 and the clock signal K.

Figure 8:
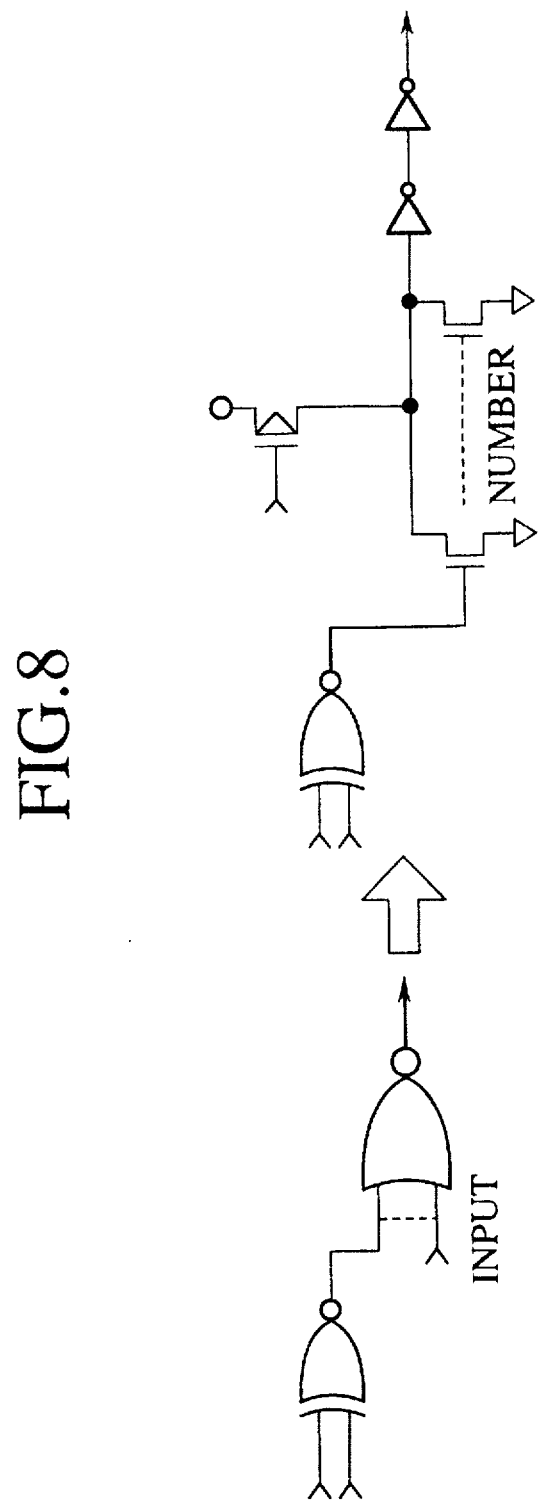
FIG. 8 is a circuit diagram showing an example of a configuration of a comparator circuit shown in FIG. 7.
Figure 9:
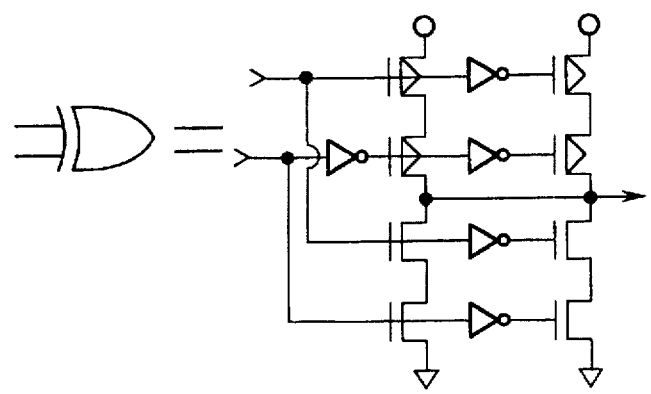
FIG. 9 is a circuit diagram showing a concrete instance of a partial configuration of a comparator circuit shown in FIG. 8.
Figure 10:
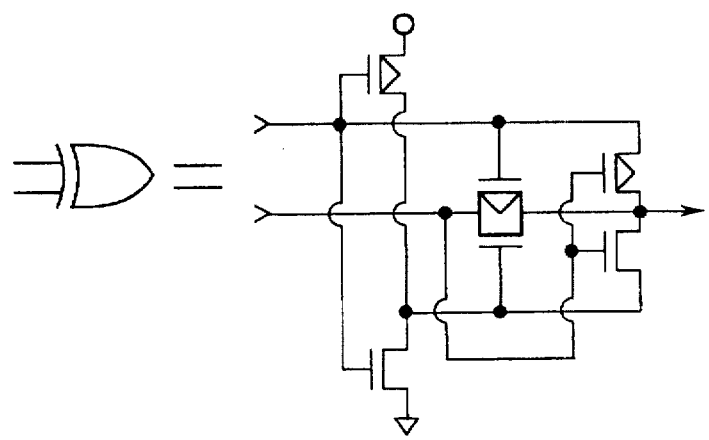
FIG. 10 is a circuit diagram showing another concrete instance of a partial configuration of a comparator circuit shown in FIG. 8.

FIG. 8 is a circuit diagram showing an example of a configuration of the comparator circuit shown in FIG. 7. As shown in FIG. 8, for example, the comparator circuit 5 is composed of a negative EX-OR circuit (exclusive-OR circuit). The EX-OR circuit is so formed as shown in FIGS. 9 and 10, for instance.

Subsequently, an operation of the first embodiment of the present invention shown in FIG. 7 will be explained with reference to a timing chart in FIG. 11. Also the aforementioned timing chart in FIG. 6 will be referred together partially.

Figure 6:
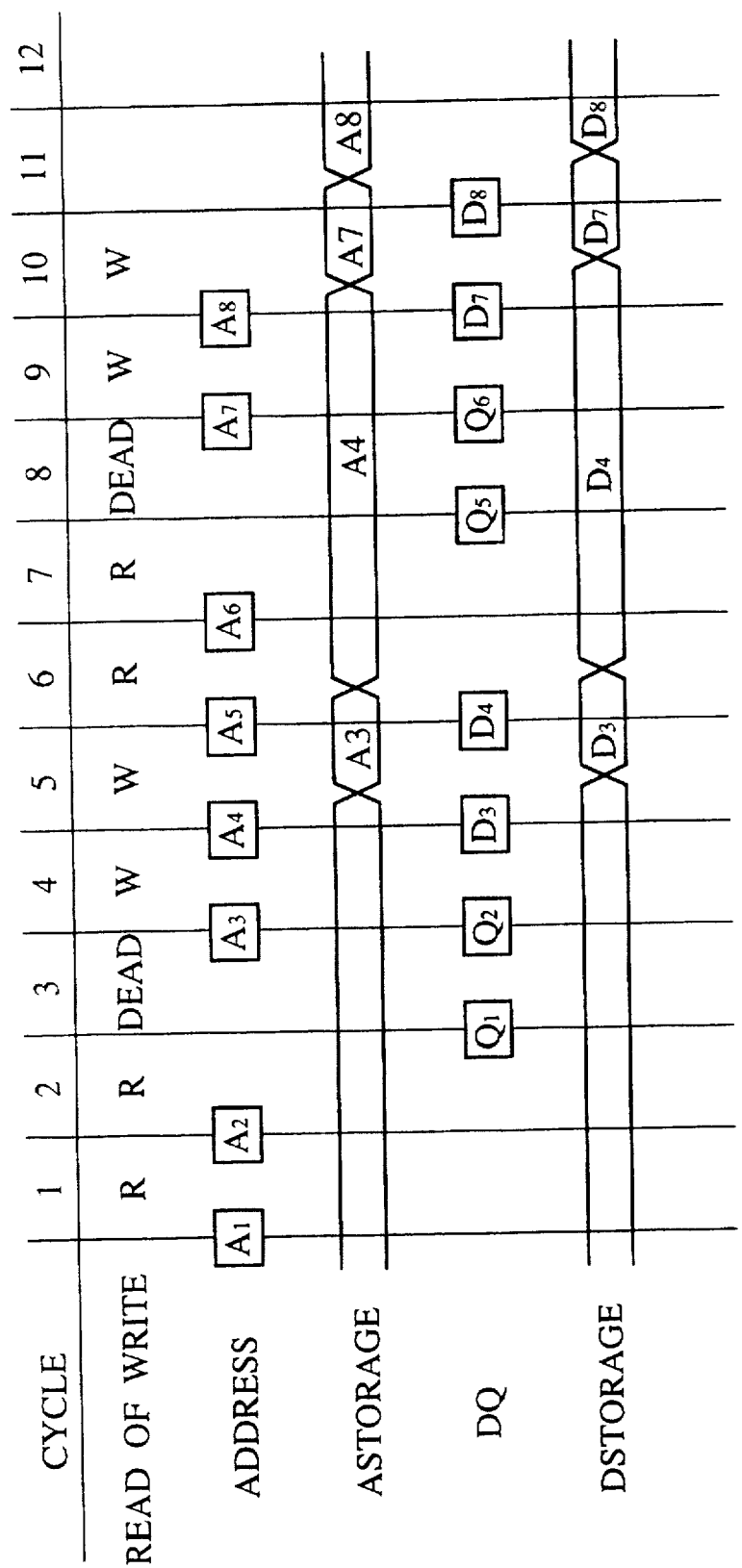
FIG. 6 is a timing chart showing an example of operation timing of a conventional synchronous type SRAM employing a conventional late write scheme.
Figure 11:
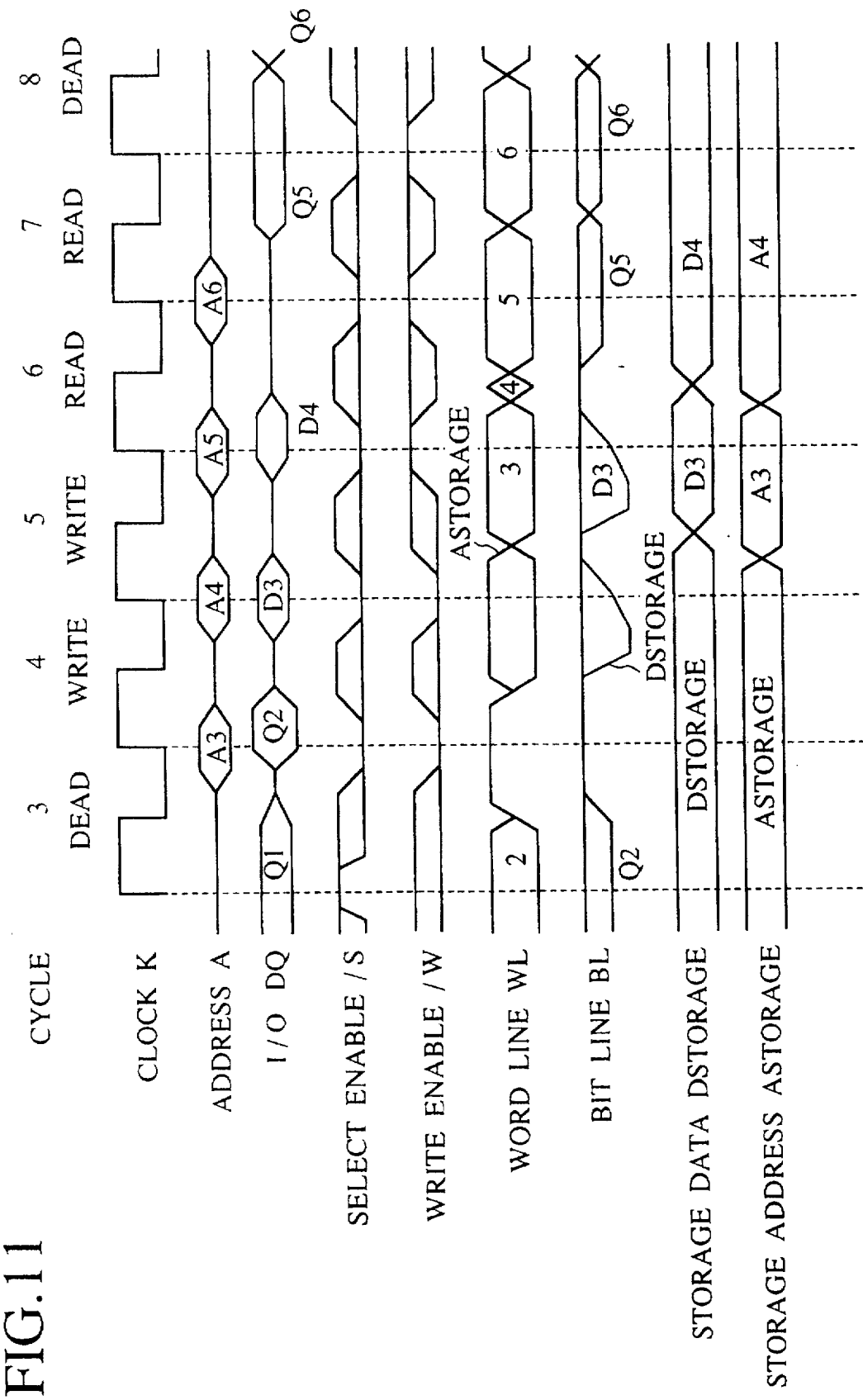
FIG. 11 is a timing chart showing an operation of the first embodiment of the present invention shown in FIG. 7.

Here, in FIGS. 11 and 6, ASTORAGE denotes an output of the second address register 2, and DSTORAGE denotes an output of the input data register 104. In addition, FIG. 11 shows internal waveforms in part of the cycles in FIG. 6.

In FIGS. 11 and 6, cycles 6, 7 are read cycles, and data Q5, Q6 corresponding respectively to addresses A5, A6 are read. In the read cycles, a certain cell in the cell array 108 is selected in accordance with the address signal from the first address register 101 which is selected by the address selection circuit 3.

In the meanwhile, write operation is effected in cycles 4 and 5. In the cycle 4, the address A3 is stored in the first address register 101. In the cycle 5, the address A3 is then stored in the second address register 2. Now, the address A3 is output from the second address register 2 as a storage address signal ASTORAGE. At the time of write operation in the cycle 5, the storage address signal ASTORAGE from the second address register 2 is selected by the address selection circuit 3. A certain cell in the cell array 108 is selected in accordance with the selected write address A3. Then data D3 from the input data register 104 as storage data DSTORAGE is written into the cell. In addition, in the cycle 5, a next write address A4 is stored in the first address register 101.

Next, in the cycle 6, the address A4 is stored in the second address register 2 from the first address register 101. Since the cycle 6 is read cycle, the write operation cannot be executed therein. However, the write address A4 is stored in the second address register 2, and write-data D4 is also stored in the input data register 104. This situation is continued until next write cycle 9.

In the next write cycle 9, a write address A7 is stored in the first address register 101. At the same time, in the cycle 9, data D4 which cannot be written into the cell in the cycle 5 is written in the cell designated by the address A4. In cycle 10, data D7 is written into the cell selected by the address A7.

As described above, when the operation of the SRAM changes from the write operation to the read operation, data is not actually written into the cell. Alternatively, the write address A4 is stored in the second address register 2, and the write data D4 is stored in the input data register 104. At the beginning of next write cycle, data is written using stored address and data.

In the read operation, in case data written in the last write cycle is read, the write data is first read from the input data register 104 and then written into the cell since data in the last write cycle has not been written into the cell, as described above. In other words, the write address in the last write cycle is stored in the second address register 2. Therefore, if the address input from the external in next read cycle (i.e., the output address signal from the first address register 101) coincides with the storage address signal ASTORAGE from the second address register 2, the comparator circuit 5 detects the coincidence, and then activates the signal FCOMPARE and deactivates the signal /FCOMPARE. As a result, the data held in the input data register 104 is selected by the output data selection circuit 6, and held in the register 105, and then read out via the output buffer 109. Thereby, data not written actually into the cell in the last write cycle can be read.

According to the first embodiment of the present invention, in addition to the first address register 101 used to store external address in the SRAM, the second address register 2 is provided to hold the write address in synchronous with the internally generated control signal, regardless of the read operation and the write operation. For this reason, the number of dead cycles which are required in the conventional synchronous SRAM to avoid a collision of read data with write data when the SRAM changes its operation from the read operation to the write operation can be reduced. As a result, a working time of the SRAM can be decreased.

(Second Embodiment)

Figure 12:
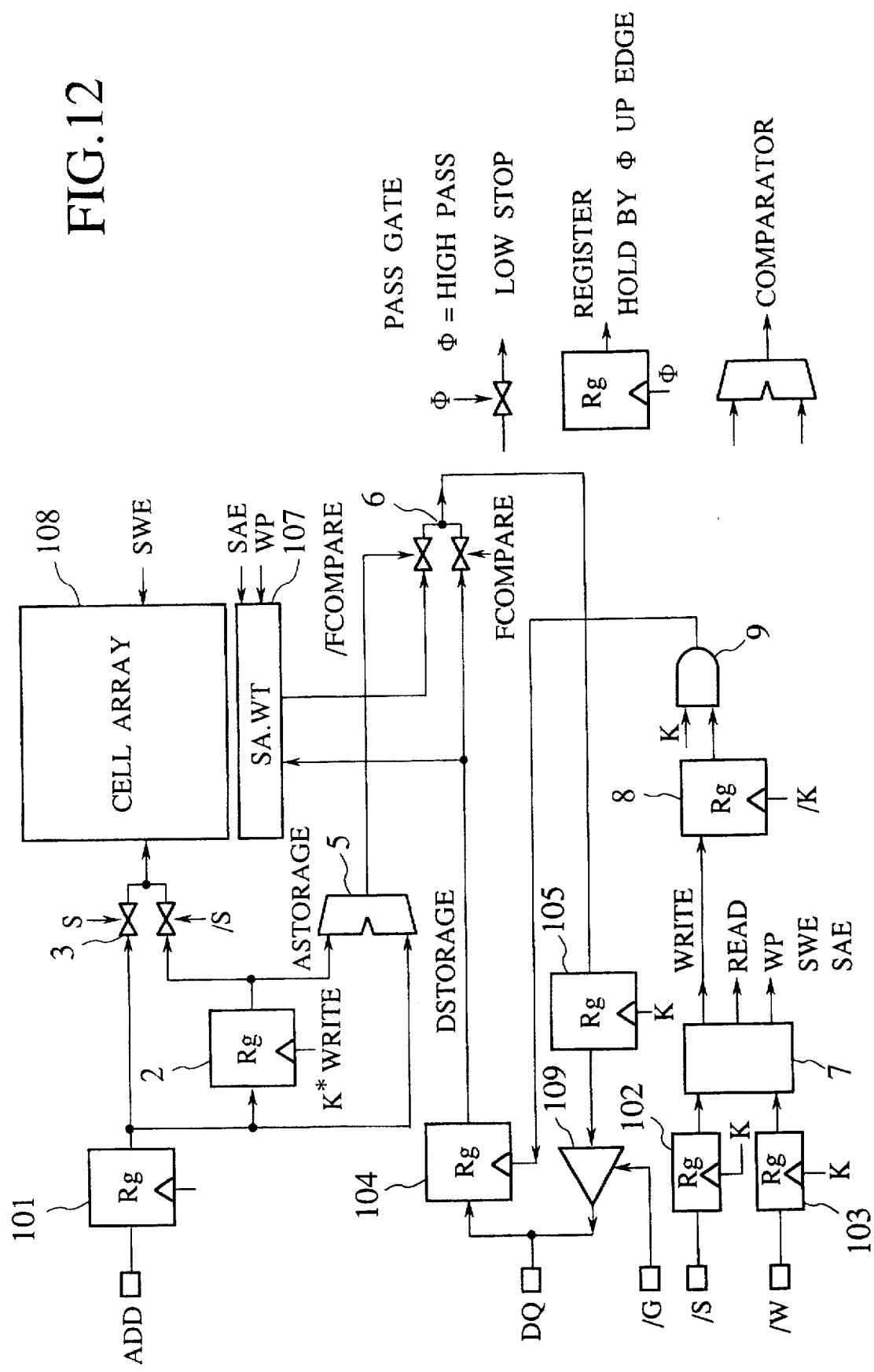
FIG. 12 is a circuit diagram showing a configuration of a semiconductor memory device of a synchronous type SRAM according to a second embodiment of the present invention.

FIG. 12 is a circuit diagram showing a configuration of a semiconductor memory device of a synchronous type SRAM according to a second embodiment of the present invention.

The second embodiment shown in FIG. 12 can be characterized, in contrast to the configuration of the first embodiment shown in FIG. 7, in that the chip select signal S and the inverted signal /S of the chip select signal S are used as the selection signal of the address selection circuit 3. Other respective portions in the configuration are the same as the configuration shown in FIG. 7. In comparison with the first embodiment, the second embodiment shown in FIG. 12 can increase a margin of the write operation and can improve extremely write recovery indicating potential recovery degree of the bit line immediately after the write operation.

Subsequently, an operation of the second embodiment will be explained with reference to a timing chart shown in FIG. 13.

In the configuration of the second embodiment shown in FIG. 12, irrespective of the write operation and the read operation, the address signal is supplied to the cell array 108 via the gate of the address selection circuit 3, to which the chip select signal S is supplied, to thus designate the cell to be selected. At this time, the write address is always stored in the second address register 2. That is, in the second embodiment, the address in the second write cycle and thereafter (i.e., cycles except for the read cycle and the first write cycle) is passed from the first address register 101 via the gate of the address selection circuit 3, to which the chip selection signal S is supplied, to thus designate the cell. In the SRAM employing the late write system, the last write operation cannot be performed in the write cycle, and thus data is written into the cell in the first write cycle of the next write cycles. Here, STORAGE CYCLE is a cycle immediately before the first write cycle of the write cycles. In the STORAGE CYCLE, the gate of the address selection circuit 3, to which the inverted signal /S of the chip select signal S is supplied, is opened and the write address is determined. The user must operate a chip select pin of the SRAM when the SRAM changes its operation from the read cycle to the write cycle. Since essentially such STORAGE CYCLE is DEAD CYCLE, a total working time is not increased even if the STORAGE CYCLE is inserted.

In such selective supply of the address signal, the read operation is similar to that performed by the configuration of the first embodiment shown in FIG. 7, but, at the time of the write operation, the address signal is supplied to the cell via the first address register 101. For this reason, in the first embodiment shown in FIG. 7, the write address is supplied to the cell in the next cycle after it is held in the first address register 101. On the contrary, in the second embodiment, the write address is supplied to the cell in the same cycle to select the cell. In other words, in FIG. 13, the word line is activated in response to the address signal A3 in the same cycle 4 as the address signal A3 is held. The write data D3 is input in the succeeding cycle. At this time, the write data D3 can be supplied immediately to the bit line since the word line 3 has been already selected in the cycle 5.

On the other hand, in the first embodiment shown in FIG. 7, the word line is activated in the middle of the cycle by the address signal which is used to write the write data D3. Therefore, in order not to write erroneously the data D3 into the cell selected by the preceding address, the write data cannot be supplied to the bit line simultaneously with the start of the cycle. Thus, the write operation must be waited until the word line is selected firmly.

Figure 13:
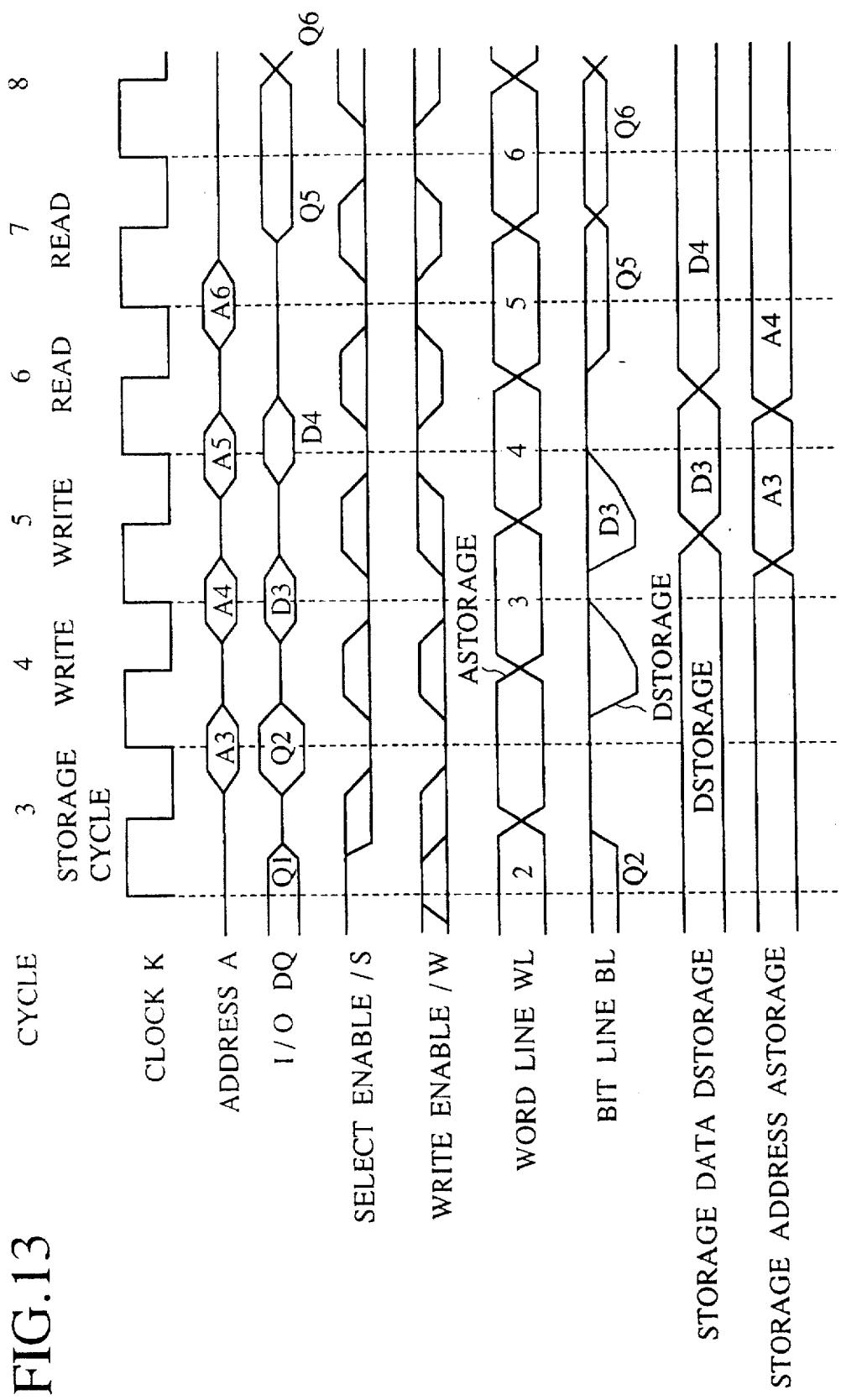
FIG. 13 is a timing chart showing an operation of the second embodiment of the present invention shown in FIG. 12.

In FIG. 13, in the cycle 5, data is written into the cell selected by the address A4 which is not used as a write address except for the write address A3. However, since right data is written into the cell which is selected by the write address A4 in the succeeding write cycle, there is caused no problem. The last address and data in the write cycles are not written into the cell like the first embodiment shown in FIG. 7, but are stored in the second address register 2 and the input data register 104.

Consequently, before next write operation, the STORAGE CYCLE is inserted by activating the inverted signal /S of the chip select signal, for instance, by the user from the external. The STORAGE CYCLE is provided to write data stored in the input data register 104 into the cell designated by the address signal stored in the second address register 2. At this time, the address stored in the second address register 2 via the gate of the address selection circuit 3, to which the inverted signal /S of the chip select signal, is supplied to the cell array 108 to thus select the cell concerned.

According to the second embodiment, in the write cycle, the write data can be supplied to the bit line immediately after it is defined if the word line designated by the write address is activated in one preceding cycle before the write data is specified. As a result, since the write margin can be increased as well as a potential of the bit line can be recovered at the early stage of the write cycle after the write operation, a delay of the read operation immediately after the write operation can be prevented. This advantage becomes remarkable in the large capacity and high speed SRAM.

(Third Embodiment)

Figure 14:
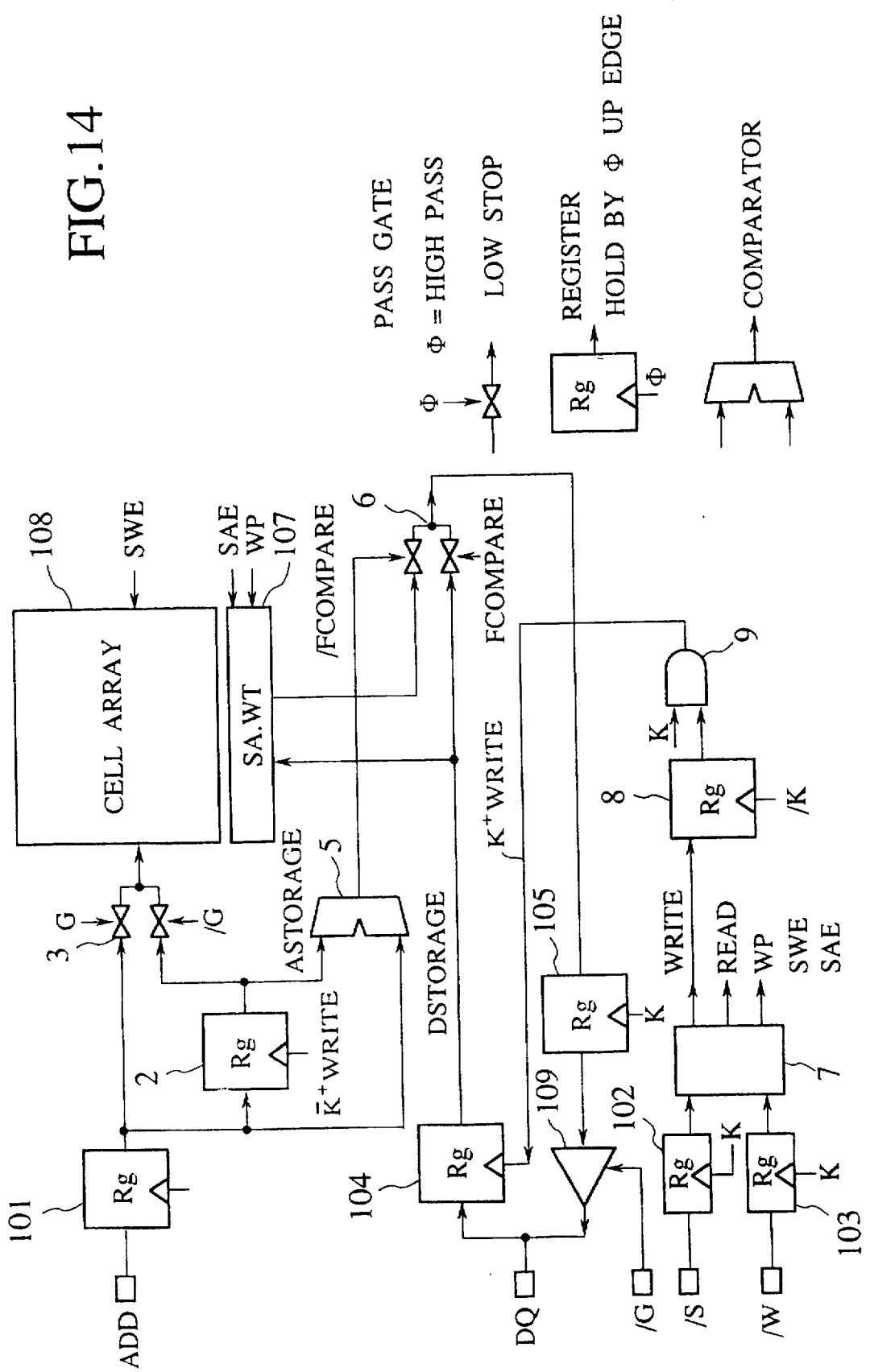
FIG. 14 is a circuit diagram showing a configuration of a semiconductor memory device of a synchronous type SRAM according to a third embodiment of the present invention.

FIG. 14 is a circuit diagram showing a configuration of a semiconductor memory device of a synchronous type SRAM according to a third embodiment of the present invention.

The third embodiment shown in FIG. 14 can be characterized, in contrast to the configuration of the second embodiment shown in FIG. 12, in that the data output control signal G and the inverted signal /G of the data output control signal G are used in stead of the chip select signal as the selection signal of the address selection circuit 3. Other respective portions in the configuration are the same as the configuration shown in FIG. 7.

Figure 15:
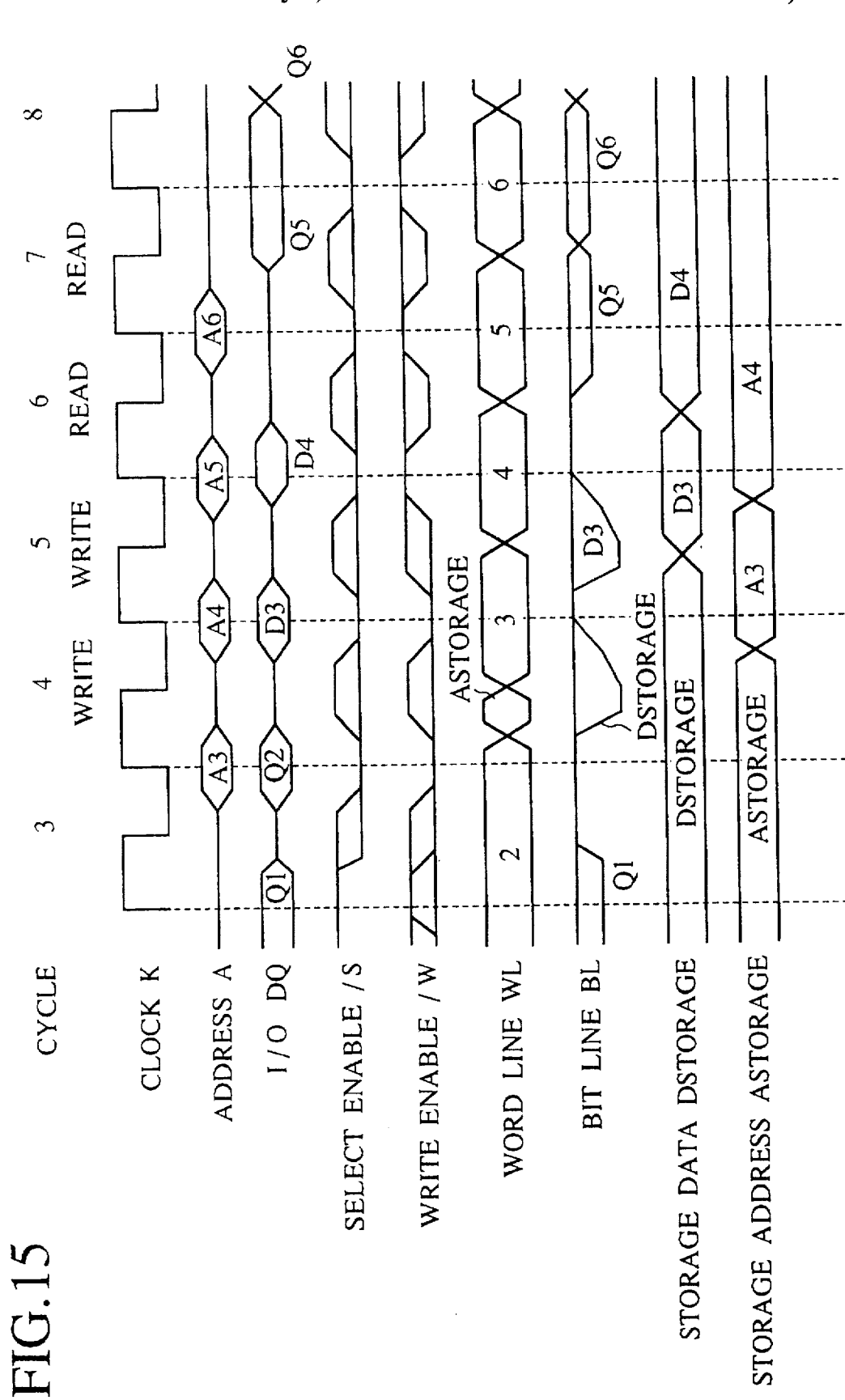
FIG. 15 is a timing chart showing an operation of the third embodiment of the present invention shown in FIG. 14.

FIG. 15 is a timing chart explaining an operation of the SRAM according to the third embodiment of the present invention.

As a feature of the third embodiment, in the configuration of the third embodiment shown in FIG. 14, the gate of the address selection circuit 3, to which the inverted signal /S of the chip select signal, is opened up to a pulse signal by detecting the write operation performed after the read operation using the write signal /W, for instance, so that data stored in the input data register 104 is written into the cell in accordance with the address stored in the second address register 2 at the first half of the cycle 4 which is the write cycle after the read operation. In FIG. 15, a state of the cycle 3 does not care.

According to the third embodiment, there can be obtained such advantage that the STORAGE CYCLE which is shown in FIG. 13 is not required and can be eliminated.

As has been described above, according to the present invention, irrespective of the read operation and the write operation, the address signal is written into the second address holding circuit which is provided in addition to the first address holding circuit and held therein, and data is written into the cell by selecting the cell in accordance with the held write address. Therefore, the semiconductor memory device employing the late write system can be provided. Therefore, continuous access operations including the read operation and the write operation can be effected effectively and at high speed.

In addition, according to the present invention, the written cell can be selected in the cycle where the write address is fetched and held, and thus data can be supplied to the bit line at the commencement of next cycle. Thus, a write margin can be increased and a delay of the read operation executed after the write operation can be prevented.

Moreover, according to the present invention, the address and data in the last write cycle are held, and the held data is read out when input read address coincides with the held address. For this reason, unless data is actually written in the cell, the data can be surely read similarly to the data written into the cell.

Further, according to the present invention, the address and data in the last write cycle are held, and the write operation can be done using held address and data at the first half of the succeeding write cycle. Therefore, a particular cycle used for effecting the write operation in the last write cycle can be neglected.

What is claimed is:

1. A semiconductor memory device of a static random access memory employing a late write system wherein access operations are effected in synchronous with a clock signal and data is written in succeeding write cycle after a write address is defined, comprising:
   a first address holding circuit for fetching, holding and outputting an address signal in synchronous with said clock signal;
   a second address holding circuit for fetching, holding and outputting a write address signal of address signals held in said first address holding circuit in synchronous with said clock signal;
   an address selection circuit for selecting either a first address signal held in said first address holding circuit as an address signal supplied to an accessed cell or a second address signal held in said second address holding circuit;
   a data holding circuit for fetching, holding and outputting write data;
   a comparator circuit for comparing said first address signal with said second address signal; and
   an output data selection circuit for selecting said write data held in said data holding circuit if said first address signal coincides with said second address signal in a comparison result by said comparator circuit and for selecting read data read out from said accessed cell unless said first address signal coincides with said second address signal, and for outputting selected data as output data.

2. A semiconductor memory device according to claim 1, wherein write operation in the last write cycle of continuous write cycles is effected before next write cycle succeeding to said last write cycle is executed.

3. A semiconductor memory device according to claim 2, wherein said address selection circuit is selectively controlled according to an internal read signal and an internal write signal generated based on an external access control signal, and selects said first address signal at the time of read operation and selects said second address signal at the time of write operation.

4. A semiconductor memory device according to claim 2, wherein, in case write data held in said data holding circuit is read in response to said write address signal which is fetched and held in said second address holding circuit in the last write cycle of continuous write cycles, said write data is selected and read by said data selection circuit in next read cycle succeeding to said last write cycle.

5. A semiconductor memory device according to claim 1, wherein said address selection circuit is selectively controlled according to an internal read signal and an internal write signal generated based on an external access control signal, and selects said first address signal at the time of read operation and selects said second address signal at the time of write operation.

6. A semiconductor memory device according to claim 5, wherein, in case write data held in said data holding circuit is read in response to said write address signal which is fetched and held in said second address holding circuit in the last write cycle of continuous write cycles, said write data is selected and read by said data selection circuit in next read cycle succeeding to said last write cycle.

7. A semiconductor memory device according to claim 1, wherein said write address signal is fetched and held in said second address holding circuit in a first write cycle, a cell is selected by said write address signal, and write data held in said data holding circuit is written in a selected cell at commencement of a second write cycle.

8. A semiconductor memory device according to claim 7, wherein a storage cycle wherein write operation is performed based on said write address signal which is fetched and held in said second address holding circuit in the last write cycle of continuous write cycles is set before next write cycle succeeding to the last write cycle.

9. A semiconductor memory device according to claim 7, wherein, in case write data held in said data holding circuit is read in response to said write address signal which is fetched and held in said second address holding circuit in the last write cycle of continuous write cycles, said write data is selected and read by said data selection circuit in next read cycle succeeding to said last write cycle.

10. A semiconductor memory device according to claim 1, wherein a storage cycle wherein write operation is performed based on said write address signal which is fetched and held in said second address holding circuit in the last write cycle of continuous write cycles is set before next write cycle succeeding to the last write cycle.

11. A semiconductor memory device according to claim 10, wherein said address selection circuit is selectively controlled by an external chip select signal or a data output control signal, selects a first address signal at the time of read operation and write operation, and selects a second address signal in said storage cycle which is set before next write cycle succeeding to the last write cycle.

12. A semiconductor memory device according to claim 10, wherein, in case write data held in said data holding circuit is read in response to said write address signal which is fetched and held in said second address holding circuit in the last write cycle of continuous write cycles, said write data is selected and read by said data selection circuit in next read cycle succeeding to said last write cycle.

13. A semiconductor memory device according to claim 1, wherein, in case write data held in said data holding circuit is read in response to said write address signal which is fetched and held in said second address holding circuit in the last write cycle of continuous write cycles, said write data is selected and read by said data selection circuit in next read cycle succeeding to said last write cycle.

14. A semiconductor memory device according to claim 1, wherein said address selection circuit is selectively controlled by an external chip select signal or a data output control signal, selects a first address signal at the time of read operation and write operation, and selects a second address signal at the first half of next write cycle succeeding to the last write cycle.

15. A semiconductor memory device according to claim 14, wherein write operation based on a write address signal which is fetched and held in said second address holding circuit in the last write cycle of continuous write cycles is effected at said first half of said next write cycle succeeding to said last write cycle.

16. A semiconductor memory device according to claim 1, wherein write operation based on a write address signal which is fetched and held in said second address holding circuit in the last write cycle of continuous write cycles is effected at said first half of said next write cycle succeeding to said last write cycle.

* * * * *